US012757762B2

(12) United States Patent
Niwa

(10) Patent No.: US 12,757,762 B2
(45) Date of Patent: Oct. 6, 2026

(54) WIRING BOARD, SEMICONDUCTOR DEVICE, AND METHOD FOR MANUFACTURING SEMICONDUCTOR DEVICE

(71) Applicant: Kioxia Corporation, Tokyo (JP)

(72) Inventor: Keiichi Niwa, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 683 days.

(21) Appl. No.: 18/177,725

(22) Filed: Mar. 2, 2023

(65) Prior Publication Data

US 2023/0411269 A1 Dec. 21, 2023

(30) Foreign Application Priority Data

Jun. 14, 2022 (JP) ................................ 2022-095942

(51) Int. Cl.
*H01L 23/498* (2006.01)
*H10B 80/00* (2023.01)
(Continued)

(52) U.S. Cl.
CPC ............ *H10W 70/65* (2026.01); *H10B 80/00* (2023.02); *H10W 70/05* (2026.01); *H10W 70/685* (2026.01); *H10W 72/072* (2026.01); *H10W 72/07236* (2026.01); *H10W 72/07354* (2026.01); *H10W 72/222* (2026.01); *H10W 72/252* (2026.01); *H10W 72/347* (2026.01); *H10W 72/865* (2026.01); *H10W 72/877* (2026.01); *H10W 72/884* (2026.01); *H10W 74/15* (2026.01); *H10W 90/724* (2026.01);
(Continued)

(58) Field of Classification Search
None
See application file for complete search history.

(56) References Cited

U.S. PATENT DOCUMENTS 7,691,670 B2 4/2010 Eslamy
8,243,462 B2 * 8/2012 Shibuya ............... H05K 1/0271 361/783

(Continued)

FOREIGN PATENT DOCUMENTS

JP H03291991 A 12/1991
JP H08293661 A 11/1996

(Continued)

OTHER PUBLICATIONS

Japanese Office Action dated Mar. 17, 2026, mailed in counterpart Japanese Application No. 2022-095942, 10 pages.

*Primary Examiner* — Long Pham
(74) *Attorney, Agent, or Firm* — Kim & Stewart LLP

(57) ABSTRACT

According to one embodiment, a wiring board, includes a conductive layer on a first surface and an insulating layer covering a portion of the conductive layer. The conductive layer includes a first connection portion exposed from the insulating layer and having a first wettability to solder, a lead-out portion connected to the first connection portion and exposed from the insulating layer and having a second wettability to solder, and a wiring portion connected to the first connection portion via the lead-out portion and covered with the insulating layer. In some examples, the first connection portion may be coated with a gold layer and the conductive layer may be copper or a copper alloy material.

15 Claims, 12 Drawing Sheets

(51) Int. Cl.

| | |
|---|---|
| ***H10W 70/05*** | (2026.01) |
| ***H10W 70/65*** | (2026.01) |
| ***H10W 70/685*** | (2026.01) |
| *H10W 72/00* | (2026.01) |
| *H10W 72/20* | (2026.01) |
| *H10W 72/30* | (2026.01) |
| *H10W 74/15* | (2026.01) |
| *H10W 90/00* | (2026.01) |

(52) U.S. Cl.

CPC ........ *H10W 90/732* (2026.01); *H10W 90/734* (2026.01); *H10W 90/752* (2026.01); *H10W 90/754* (2026.01)

(56) References Cited

U.S. PATENT DOCUMENTS

| | | | | |
|---|---|---|---|---|
| 10,117,329 | B2 | 10/2018 | Brunner | |
| 10,892,217 | B2 | 1/2021 | Arai | |
| 2009/0236756 | A1 | 9/2009 | Kim | |
| 2011/0169170 | A1 | 7/2011 | Baba | |
| 2014/0001637 | A1 | 1/2014 | Ohsumi | |
| 2020/0411425 | A1 | 12/2020 | Nishimura | |
| 2021/0066249 | A1 | 3/2021 | Niwa | |
| 2022/0005779 | A1 * | 1/2022 | Niwa .................. | H10W 70/685 |
| 2022/0028815 | A1 | 1/2022 | Takaku | |
| 2022/0059493 | A1 * | 2/2022 | Okada ................. | H10W 74/012 |

FOREIGN PATENT DOCUMENTS

| | | | |
|---|---|---|---|
| JP | H09153519 | A | 6/1997 |
| JP | 2011146489 | A | 7/2011 |
| JP | 2014029972 | A | 2/2014 |
| JP | 2015533260 | A | 11/2015 |
| JP | 2020021796 | A | 2/2020 |
| JP | 2021005687 | A | 1/2021 |
| JP | 2021034606 | A | 3/2021 |
| TW | 202203417 | A | 1/2022 |
| TW | 202205588 | A | 2/2022 |

* cited by examiner

WIRING BOARD, SEMICONDUCTOR DEVICE, AND METHOD FOR MANUFACTURING SEMICONDUCTOR DEVICE

CROSS-REFERENCE TO RELATED APPLICATION(S)

This application is based upon and claims the benefit of priority from Japanese Patent Application No. 2022-095942, filed Jun. 14, 2022, the entire contents of which are incorporated herein by reference.

FIELD

Embodiments described herein relate generally to a wiring board, a semiconductor device, and a method for manufacturing a semiconductor device.

BACKGROUND

A semiconductor device in which a semiconductor memory and a memory controller are packaged together is known. In such a semiconductor device, semiconductor memory chips, a memory controller, and the like are sometimes flip-chip bonded to a substrate.

In flip-chip bonding, bumps on a semiconductor chip are connected to terminals on a substrate with solder, but the solder may spread over the electrodes beyond the range assumed in the design and this may cause undesirable results.

DETAILED DESCRIPTION

Figure 1:
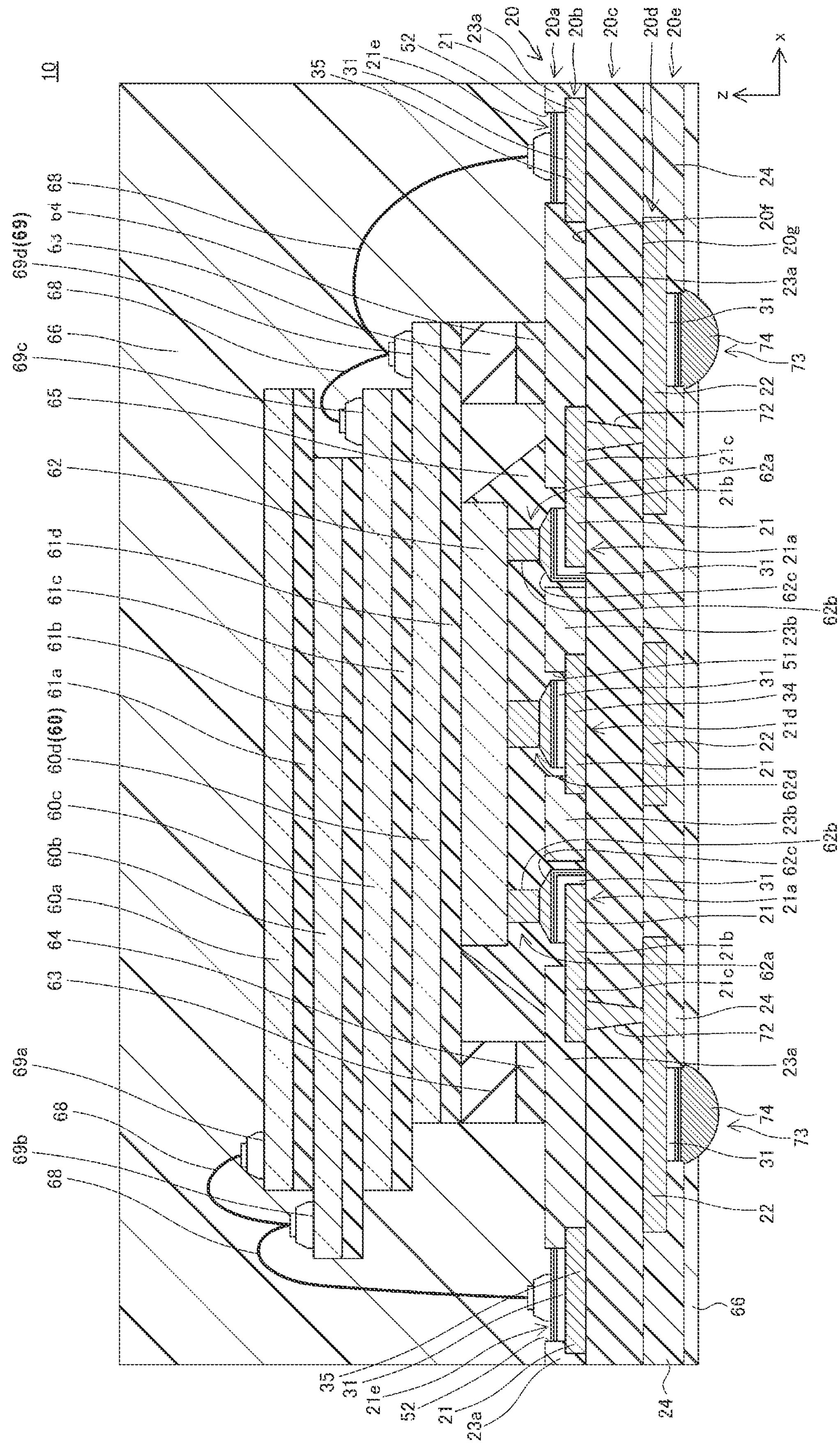
FIG. 1 is a schematic diagram of a semiconductor device according to an embodiment.

Embodiments provide a wiring board, a semiconductor device, and a method for manufacturing a semiconductor device that can reduce issues that might otherwise be caused by solder spreading over electrodes when a semiconductor element is flip-chip connected to a wiring board.

In general, according to one embodiment, a wiring board, includes a conductive layer on a first surface and an insulating layer covering a portion of the conductive layer. The conductive layer includes a first connection portion exposed from the insulating layer and having a first wettability to solder, a lead-out portion connected to the first connection portion and exposed from the insulating layer and having a second wettability to solder, and a wiring portion connected to the first connection portion via the lead-out portion and covered with the insulating layer.

In general, according to one embodiment, a wiring board includes: a conductive layer formed on a main surface and an insulating layer covering a portion of the conductive layer. The conductive layer includes: a first connection portion having a first wettability to solder and exposed from the insulating layer; a lead-out portion connected to the first connection portion that has a second wettability to the solder, which is lower than the first wettability, and is exposed from the insulating layer; and a wiring portion connected to the first connection portion via the lead-out portion and covered with the insulating layer.

A wiring board according to another embodiment includes a conductive layer formed on a main surface and an insulating layer covering a portion of the conductive layer. The conductive layer includes: a first connection portion formed with a first metal containing gold as a main component; a lead-out portion connected to the first connection portion, formed with a second metal containing copper as a main component, and exposed from the insulating layer; and a wiring portion connected to the first connection portion via the lead-out portion and covered with the insulating layer.

A semiconductor device according to still another embodiment includes a wiring board with a conductive layer formed on a main surface and an insulating layer covering a portion of the conductive layer. The conductive layer includes: a first connection portion having a first wettability to solder and exposed from the insulating layer; a lead-out portion connected to the first connection portion that has a second wettability to the solder, which is smaller than the first wettability, and is exposed from the insulating layer; and a wiring portion connected to the first connection portion via the lead-out portion and covered with the insulating layer. The semiconductor device further includes a first semiconductor element having a first electrode connected to the first connection portion.

A method for manufacturing a semiconductor device according to an embodiment includes: forming a conductive layer having a second wettability to solder or a conductive layer containing a second metal containing copper as a main component on a main surface; forming an insulating layer covering a first conductive portion that is a portion of the conductive layer; forming a resist layer covering a second conductive portion that is a portion of another portion of the conductive layer exposed from the insulating layer; when a third conductive portion that is a portion of the conductive layer exposed from the insulating layer and the resist layer has the second wettability, forming a first connection portion based on the third conductive portion by treating the third conductive portion so as to have a first wettability larger than the second wettability to the solder or, when third conductive portion contains the second material, forming the first connection portion based on the third conductive portion by forming the first metal containing gold as a main component on the third conductive portion by plating; removing the resist layer; and connecting a first electrode of a first semiconductor element to the first connection portion so that the first electrode faces the first connection portion.

Hereinafter, certain example embodiments will be described with reference to the accompanying drawings. For facilitating understanding of the description, the same components in each drawing are denoted by the same reference symbols, and redundant description of repeated aspects in the drawings may be omitted. A configuration of a semiconductor device 10 according to the embodiment will be described below. Each drawing may have an x axis, a y axis, and a z axis. The x axis, the y axis, and the z axis form a right-handed three-dimensional perpendicular coordinate system. Hereinafter, the arrow direction of the x axis may be referred to as a positive side of the x axis, and the opposite direction of the arrow may be referred to as a negative side of the x axis. The same applies to the other axes. It is noted that the positive side of the z axis and the negative side of the z axis are sometimes referred to as the "upper side" and the "lower side", respectively. In addition, in some cases, the z axis direction is referred to as the "stacking direction". In addition, planes perpendicular to the x axis, the y axis, or the z axis are sometimes called a yz-plane, a zx-plane, or a xy-plane.

Figure 2:
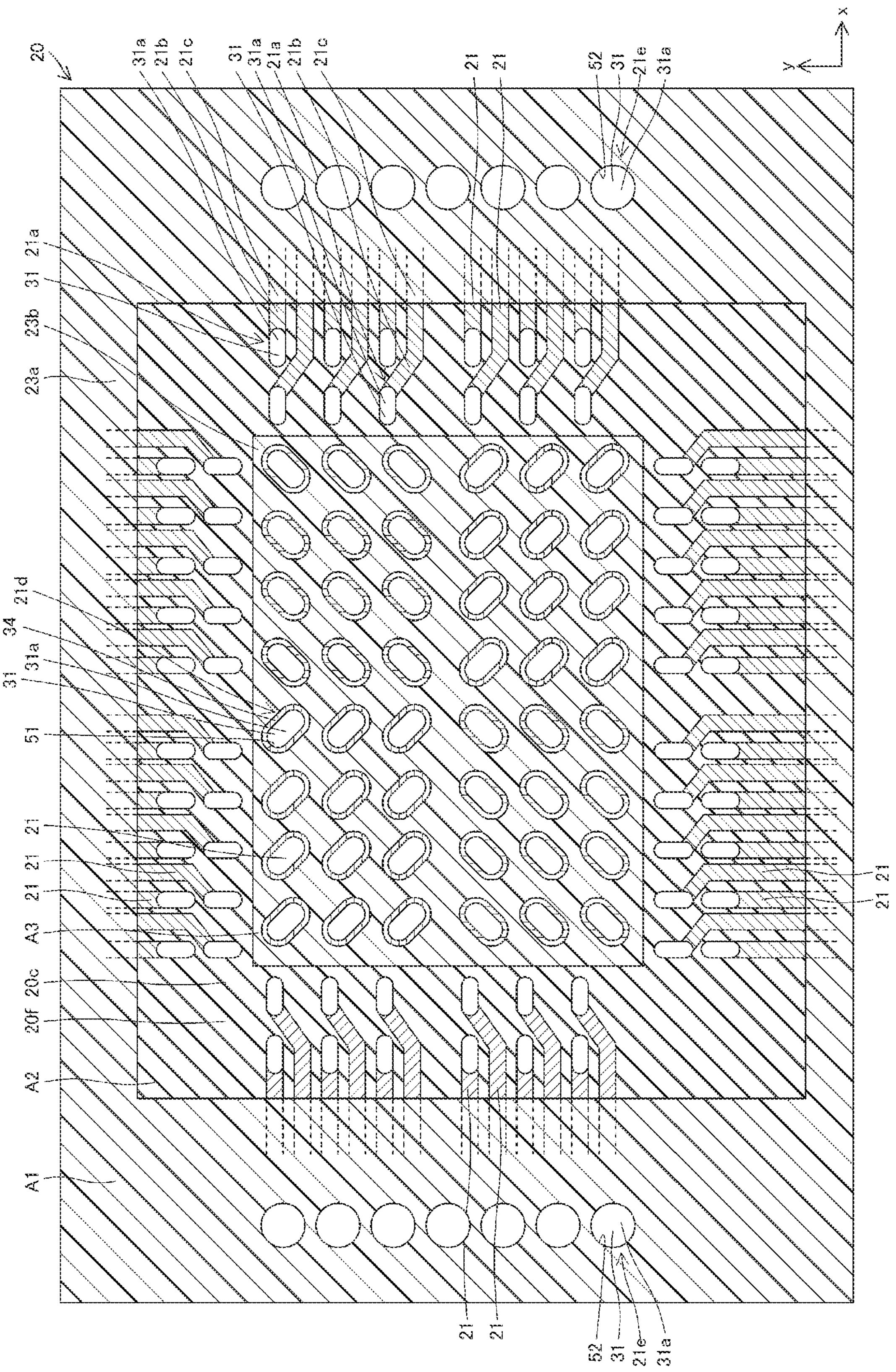
FIG. 2 is a plan view of a wiring board according to an embodiment.

As illustrated in FIGS. 1 and 2, a semiconductor device 10 includes a wiring board 20, memory chips 60*a*, 60*b*, 60*c*, and 60*d*, die attach films 61*a*, 61*b*, 61*c*, and 61*d*, a logic/interface chip 62 (a first semiconductor element), a spacer 63, an adhesive film 64, an underfill resin 65, a mold resin 66, and bonding wires 68. FIG. 2 illustrates a completed state of the wiring board 20 before mounting of the memory chip 60*a* and the like. The logic/interface chip 62 is a chip capable of controlling the memory chips 60*a*, 60*b*, 60*c*, and 60*d*.

Hereinafter, each of the memory chips 60*a*, 60*b*, 60*c*, and 60*d* may be referred to as a memory chip 60 (a second semiconductor element).

The wiring board 20 includes solder resist layers 20*a* and 20*e* (insulating layers), conductive layers 20*b* and 20*d*, and an insulating layer 20*c*.

The solder resist layer 20*a*, the conductive layer 20*b*, the insulating layer 20*c*, the conductive layer 20*d*, and the solder resist layer 20*e* are layers extending substantially parallel to the xy plane and are stacked in this order from the upper side to the lower side.

The insulating layer 20*c* has an upper surface (hereinafter, sometimes referred to as a main surface 20*f*) that is substantially parallel to the xy plane and a lower surface (hereinafter, sometimes referred to as a main surface 20*g*) that is substantially parallel to the xy plane. The insulating layer 20*c* is formed of, for example, a "prepreg" material for electrical circuit boards, printed circuit boards, or the like. It is noted that in some examples one or more internal conductive layers may be formed inside the insulating layer 20*c*.

The conductive layers 20*b* and 20*d* are made of, for example, a metal (hereinafter, sometimes referred to as a second metal) containing copper as a main component. The conductive layers 20*b* and 20*d* have patterns 21 and 22, respectively, which are wiring patterns (hereinafter, "wiring patterns" may be simply referred to as "patterns"). The patterns 21 and 22 are formed on the main surfaces 20*f* and 20*g*, respectively.

The pattern 21 includes a plurality of first connection portions 21*a* (third conductive portions), a plurality of lead-out portions 21*b*, a plurality of wiring portions 21*c*, a plurality of second connection portions 21*d*, and a plurality of third connection portions 21*e*. The first connection portion 21*a*, the lead-out portion 21*b*, and the wiring portion 21*c* are integrally formed in this example.

The first connection portion 21*a* and the second connection portion 21*d* are board-side flip-chip mounting terminals (also referred to as flip chip pads) used for flip-chip connecting the logic/interface chip 62 to the wiring board 20.

The third connection portion 21*e* is a wire bonding mounting terminal (also referred to as a wire bonding pad) used for wire bonding between the memory chip 60 and the wiring board 20. Each of the first connection portion 21*a*, the second connection portion 21*d*, and the third connection portion 21*e* includes an electroless NiPdAu plating 31 (electroless plated film(s)). Details of the electroless NiPdAu plating 31 will be described later.

A plurality of through via holes 72 are formed in the insulating layer 20*c*. Some of the electrodes provided in the pattern 21 and some of the electrodes provided in the pattern 22 are electrically connected by connections made through the through via holes 72.

The solder resist layer 20*a* includes solder resists 23*a* and 23*b* (solder resist portions). Each of the solder resists 23*a* and 23*b* covers a portion of the pattern 21 and a portion of the main surface 20*f* of the insulating layer 20*c* from the upper side. When the wiring board 20 is completed, the pattern 21, the insulating layer 20*c*, or the electroless NiPdAu plating 31 is exposed where the solder resist 23*a* or 23*b* is not formed (absent).

The solder resist layer 20*e* includes a solder resist 24. The solder resist 24 covers a portion of the pattern 22 and a portion of the main surface 20*g* of the insulating layer 20*c* from the lower side. A plurality of openings are formed in the solder resist 24 when the wiring board 20 is finished. Ball lands 73 are formed in the plurality of openings in the solder resist 24. Specifically, the patterns 22 provided with the electroless NiPdAu plating 31 are provided in the plurality of openings. It is noted that in some examples patterns 22 covered with an organic solderability preservative (OSP) film, which may be referred to as CuOSP or anti-tarnish film, may be provided in the plurality of openings instead of the patterns 22 with the electroless NiPdAu plating 31 thereon.

Solder balls 74 are formed on the electroless NiPdAu plating 31 in the plurality of openings. It is noted that solder in this specification takes the meaning of those skilled in the art as a meltable metal or metal alloy used for making connections between (joining) different components. In general, the solder is electrically conductive. For example, the solder may have tin (Sn) as the main component.

The logic/interface chip 62 is flip-chip connected to the upper side of the wiring board 20. Specifically, the logic/interface chip 62 includes a plurality of chip-side flip-chip mounting terminals 62*a* (first electrodes) and a plurality of chip-side flip-chip mounting terminals 62*d* (second electrodes).

The chip-side flip-chip mounting terminals 62*a* include copper pillars 62*b* extending downward from the lower surface of the logic/interface chip 62 and solder bumps 62*c* provided at distal ends of the copper pillars 62*b*. The chip-side flip-chip mounting terminals 62*d* have the same general configuration as the chip-side flip-chip mounting terminals 62*a*.

The chip-side flip-chip mounting terminals 62*a* are, for example, terminals for transmitting control signals for causing the memory chip 60 to read and write data. The chip-side flip-chip mounting terminals 62*d* are, for example, terminals for connecting the logic/interface chip 62 to power supply lines or ground electrodes on the wiring board 20.

The plurality of chip-side flip-chip mounting terminals 62*a* are connected to the plurality of first connection portions 21*a*, that is, the flip chip pads 21*a* with the solder bumps 62*c*, respectively, and the plurality of chip-side flip-chip mounting terminals 62*d* are connected to the plurality of the second connection portions 21*d*, that is, the flip chip pads 21*d* with the solder bumps, respectively. Accordingly, the logic/interface chip 62 is flip-chip connected to the wiring board 20.

The memory chips 60 are stacked on the logic/interface chip 62. Specifically, in this example, the spacer 63 is adhered to the upper surface of the solder resist 23*a* with the adhesive film 64. The memory chip 60*d* is adhered to the upper surface of the spacer 63 and the upper surface of the logic/interface chip 62 with the die attach film 61*d*.

Above the memory chip 60*d*, the memory chips 60*c*, 60*b*, and 60*a* are adhered to the lower adjacent memory chip 60 with the die attach films 61*c*, 61*b*, and 61*a*, respectively.

In this example, when upper memory chip 60 is adhered to the lower memory chip 60, a portion of the upper surface of the lower memory chip 60 is left exposed (that is, adjacent memory chips are partially offset from one another in position along the x direction or the like). The upper surface of the uppermost memory chip 60, that is, the memory chip 60*a*, is entirely exposed (that is, no other memory chip 60 covers the upper surface of memory chip 60*a*).

Electrodes 69*a*, 69*b*, 69*c*, and 69*d* are provided on the exposed upper surfaces of the memory chips 60*a*, 60*b*, 60*c*, and 60*d*, respectively. Hereinafter, each of the electrodes 69*a*, 69*b*, 69*c*, and 69*d* may be referred to as an electrode 69. The bonding wire 68 electrically connects an electrode 69 and a third connection portion 21*e*, that is, the wire bonding pad 21*e*.

The underfill resin 65 is provided in a region between the chip-side flip-chip mounting terminals 62*a* and 62*d* and the memory chip 60*d* and the wiring board 20.

The underfill resin 65 is used in order to relieve stress on the chip-side flip-chip mounting terminals 62*a* and 62*d* of the logic/interface chip 62.

The mold resin 66 is provided in a region between the memory chip 60*d* and the wiring board 20. The mold resin 66 is a resin for sealing (encapsulating) the memory chip 60 and the logic/interface chip 62 and can be a thermosetting resin such as an epoxy resin. The mold resin 66 may contain glass fibers and inorganic particles as fillers. The mold resin 66 may contain a higher content of fillers than the underfill resin 65. The mold resin 66 also has a higher elastic modulus and Young's modulus than the underfill resin 65. It is noted that a heat dissipation sheet may be provided between the mold resin 66 and the underfill resin 65 in some examples.

Figure 3:
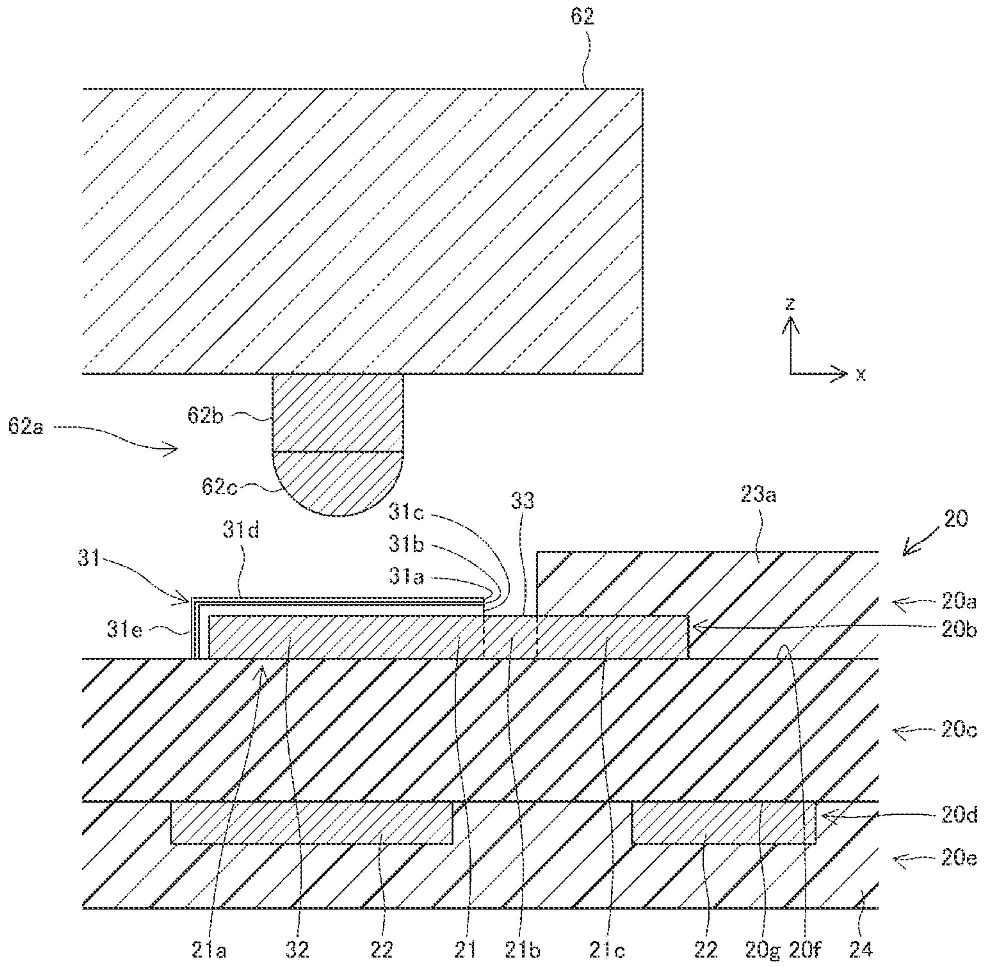
FIG. 3 is a schematic cross-sectional view of a semiconductor device before connection of a semiconductor chip of an embodiment to a wiring board.

FIG. 3 illustrates a cross section when the logic/interface chip 62 is viewed from the negative side of the y axis to the positive side of the y axis.

As illustrated in FIG. 3, the flip chip pad 21*a* includes the electroless NiPdAu plating 31 and the Cu wiring 32 (third conductive portion). The electroless NiPdAu plating 31 includes an Au layer 31*a*, a Pd layer 31*b*, and an Ni layer 31*c*.

The flip chip pad 21*a* has a wettability of a first value (a first wettability) towards solder. The Au layer 31*a* contains gold (sometimes referred to as a first metal) as a main component and is located on the front side of the flip chip pad 21*a*. The first metal provides the first wettability towards solder.

Figure 4:
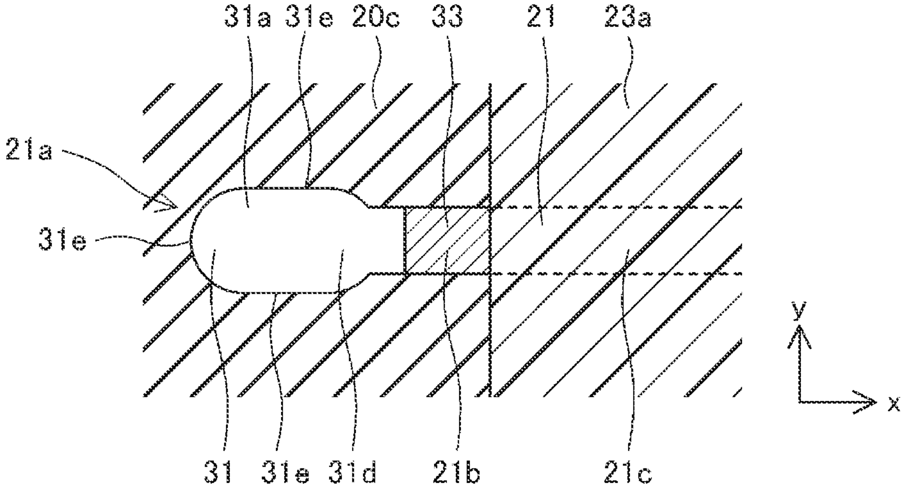
FIG. 4 is an enlarged plan view of a pad according to an embodiment.

As illustrated in FIGS. 3 and 4, the flip chip pad 21*a* has a plate-like shape having a surface 31*d* substantially parallel to the main surface 20*f* and a side surface 31*e* connected to the surface 31*d* and substantially parallel to the z axis. The Au layer 31*a* is located over both the surface 31*d* and the side surface 31*e*.

Specifically, the electroless NiPdAu plating 31 is formed on the Cu wiring 32. In the electroless NiPdAu plating 31, the Ni layer 31*c*, the Pd layer 31*b*, and the Au layer 31*a* are located in this order from the Cu wiring 32. That is, the Ni layer 31*c* is in contact with the Cu wiring 32. The Au layer 31*a* is located on the outermost side, is exposed, and has a first wettability. The Pd layer 31*b* is located between the Au layer 31*a* and the Ni layer 31*c*.

The lead-out portion 21*b* is connected to the flip chip pad 21*a* and has a wettability of a second value (a second wettability) towards solder. The second wettability is less than the first wettability (that is, the solder is less wettable on the lead-out portion 21*b* than on the Au layer 31*a*. Specifically, the second metal is located on the front side of the lead-out portion 21*b*. The second metal provides the second wettability.

In an embodiment, the lead-out portion 21*b* is a bare Cu wiring 33 when the wiring board 20 is completed. That is, the second metal having a second wettability is exposed in the lead-out portion 21*b*.

The wiring portion 21*c* is connected to the flip chip pad 21*a* through the lead-out portion 21*b* and is covered with the solder resist 23*a*. The height of the lead-out portion 21*b* from the main surface 20*f* and the height of the wiring portion 21*c* from the main surface 20*f* are substantially the same.

In an embodiment, the conductive layer 20*b* has the same thickness over substantially the entire main surface 20*f*. The pattern 21 is formed by etching the conductive layer 20*b*. In an embodiment, the thickness of the pattern 21 is substantially the same regardless of the location since a process of irradiating the pattern 21 with laser light is not used. Therefore, the thickness of the lead-out portion 21*b* and the thickness of the wiring portion 21*c* can be substantially the same. With such a configuration, the deterioration of electrical characteristics based on the increase in electrical resistance can be reduced upon reductions in the thickness of the pattern 21 can be avoided.

As illustrated in FIG. 2, an area A1 (first area), an area A2 (second area), and an area A3 (third area) are present on the wiring board 20.

The area A3 is covered with the solder resist 23*b* which has a plurality of openings 51 (first openings). The flip chip pad 21*d* is formed in an opening 51 and has a first wettability. The Au layer 31*a* is located on the front side of the flip chip pad 21*d*.

The outer edge of the area A3 is rectangular in this example. In the area A3, a plurality of slot-shaped openings 51 are provided in the solder resist 23*b*. The flip chip pad 21*d* includes the electroless NiPdAu plating 31 and the Cu electrode 34 that is a portion of the pattern 21.

The Cu electrode 34 provided in the pattern 21 is exposed in an opening 51. The electroless NiPdAu plating 31 is provided on the upper surface of the Cu electrode 34 so as not to be in contact with the outer edge of the opening 51. That is, when the wiring board 20 is completed, the Cu electrode 34 is left exposed in an annular region along the edge of each opening 51.

The planar area of the opening 51 is smaller than the planar area of the Cu electrode 34. That is, the over-resist design is made such that the opening 51 of the solder resist 23*b* becomes the land size. The flip chip pad 21*d* is a Solder Mask Defined (SMD) type pad.

The area A2 includes the flip chip pads 21*a* and the lead-out portions 21*b*. The area A2 surrounds the area A3 in an XY plane.

The area A2 is rectangular. The solder resists 23*a* and 23*b* are not provided in area A2. Therefore, in the area A2, when the wiring board 20 is completed, the main surface 20*f*, the flip chip pads 21*a*, and the lead-out portions 21*b* of the insulating layer 20*c* are left exposed. That is, the flip chip pad 21*a* is a Nonsolder Mask Defined (NSMD) type pad.

The area A1 includes the wiring portion 21*c* and is covered with the solder resist 23*a*. The area A1 surrounds the area A2 in an XY plane.

The area A1 is rectangular. A plurality of openings 52 (second openings) are formed in the solder resist 23*a*. The wire bonding pads 21*e* are formed in the openings 52. The wire bonding pad 21*e* has a first wettability.

The wire bonding pad 21*e* includes the electroless NiPdAu plating 31 and the Cu electrode 35 that is a portion of the pattern 21. The planar area of the opening 52 is less than the size of the Cu electrode 35. That is, the wire bonding pad 21*e* is an SMD type pad. It is noted that the wire bonding pad 21*e* may be an NSMD type pad in other examples.

The electroless NiPdAu plating 31 is provided on the upper surface of the Cu electrode 35 so as to be in contact with the edge of the opening 52. When the wiring board 20 is completed, the Au layer 31*a* of the electroless NiPdAu plating 31 is exposed in the opening 52.

The wiring portion 21*c* is covered with the solder resist 23*a*. Therefore, when the wiring board 20 is completed, the wiring portion 21*c* is not left exposed.

Figure 5:
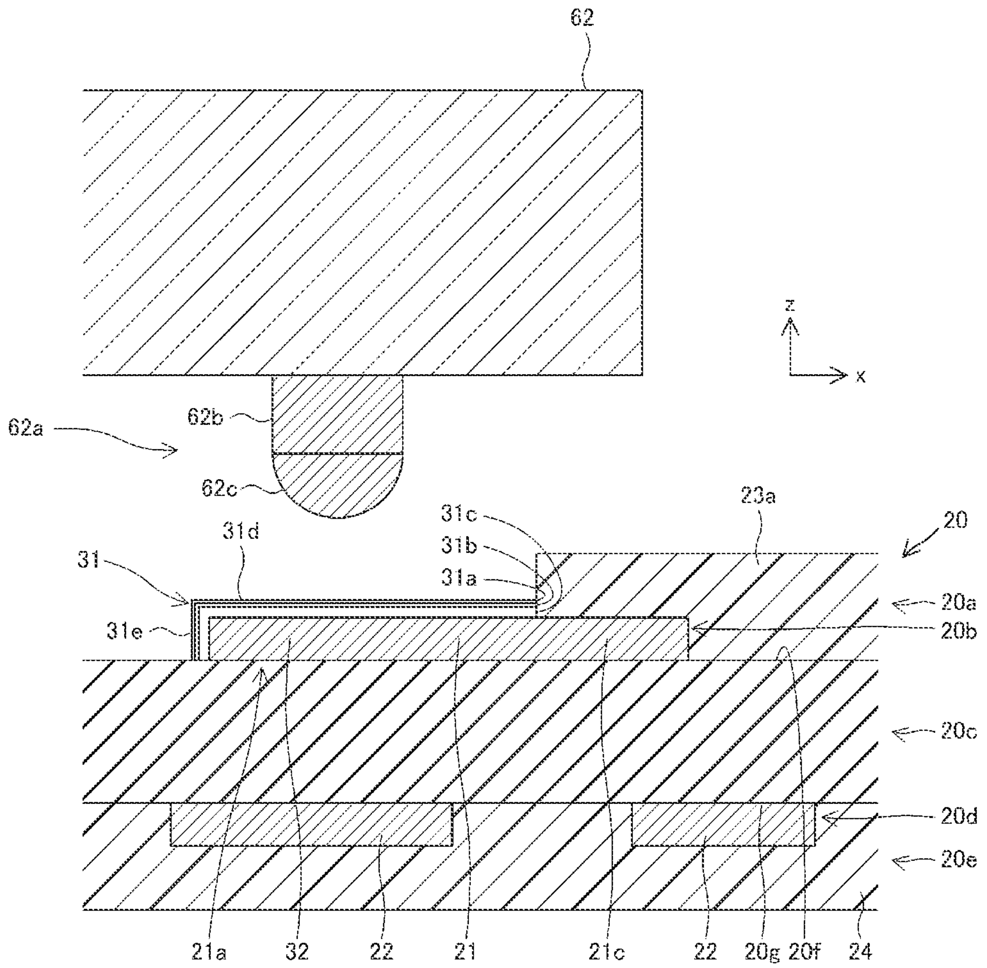
FIG. 5 is a schematic cross-sectional view of a semiconductor device before connection of a semiconductor chip of a comparative example to a wiring board.
Figure 6:
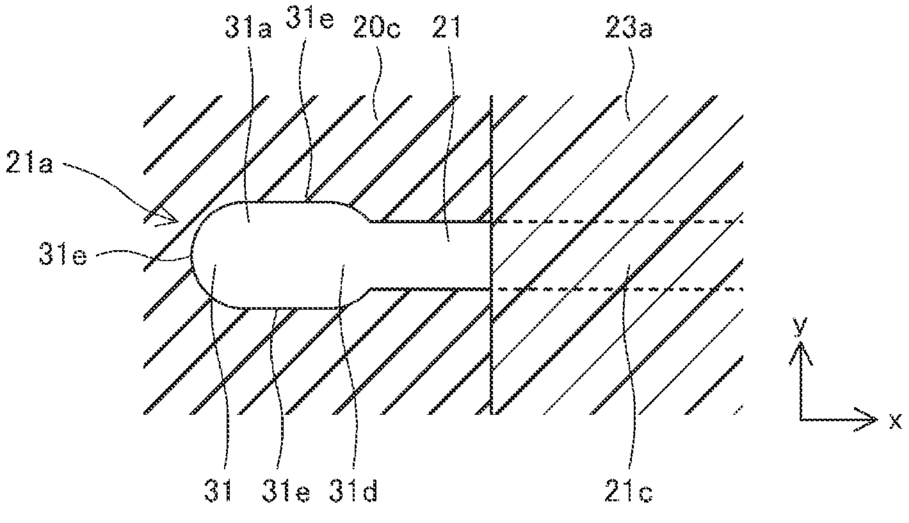
FIG. 6 is an enlarged plan view of a pad of a comparative example.

FIGS. 5 and 6 illustrate aspects of a Comparative Example. In general, FIGS. 5 and 6 correspond to FIGS. 3 and 4 depicting an embodiment. In the Comparative Example, electroless NiPdAu plating 31 is in contact with the solder resist 23*a*. Therefore, the wiring portion 21*c* is directly connected to the flip chip pad 21*a*.

Figure 7:
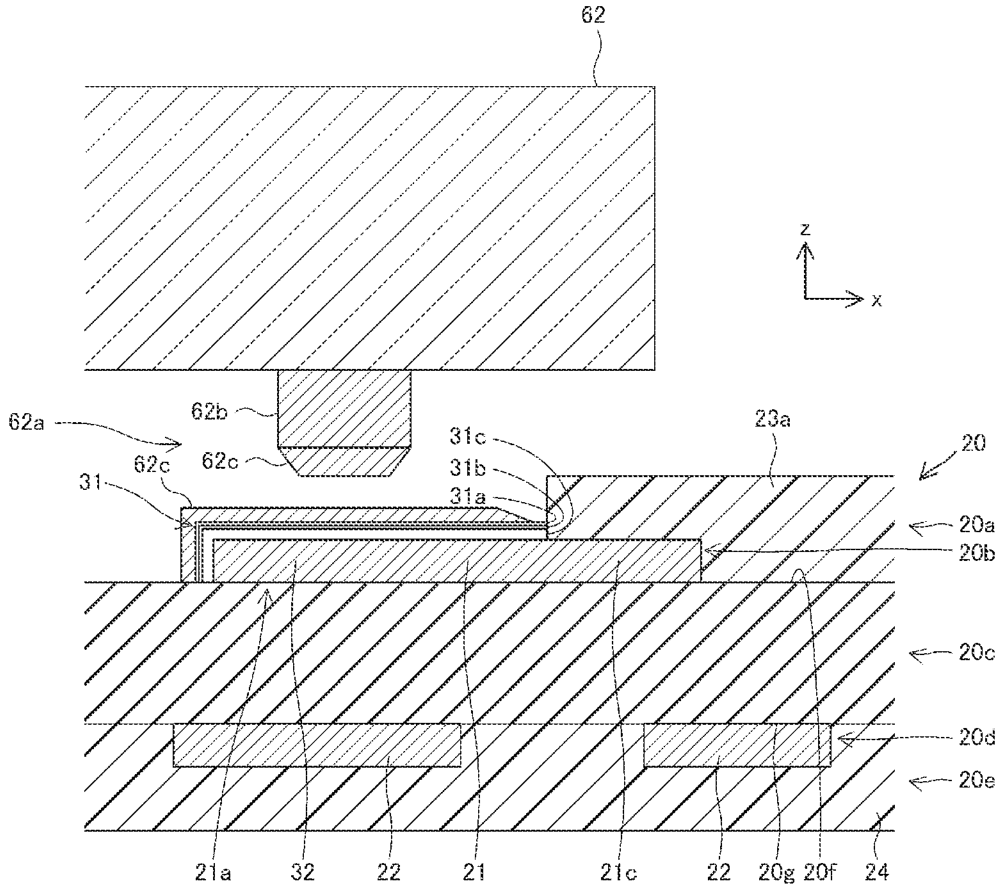
FIG. 7 is a schematic cross-sectional view of a semiconductor device of a comparative example after a reflow process.

As illustrated in FIG. 7 for the Comparative Example, the solder bumps 62*c* on the chip-side flip-chip mounting terminals 62*a* are melted in a reflow process when the logic/interface chip 62 is flip-chip connected.

In this process, the melted solder bump 62*c* is in contact with both the copper pillar 62*b* and the electroless NiPdAu plating 31 (hereinafter, this state is sometimes referred to as a both-contacted state). However, since the Au layer 31*a* has a high wettability (first wettability) towards solder, the solder bump 62*c* spreads over the entire Au layer 31*a*. The amount of solder between the copper pillar 62*b* and the electroless NiPdAu plating 31 may be insufficient for such coverage, and thus, sometimes, the both-contacted state is less likely to be maintained.

In addition, the logic/interface chip 62 may be warped in the reflow process. When such warping occurs, the distance between the flip chip pad 21*a* and the copper pillar 62*b* may become larger than intended or designed. For the flip chip pad 21*a* at such a large distance from the copper pillar 62*b*, the both-contacted state is even less likely to be maintained.

When the both-contacted state cannot be maintained, the copper pillar 62*b* and the flip chip pad 21*a* are not electrically connected and will be in an open electrical state (non-connection).

Figure 8:
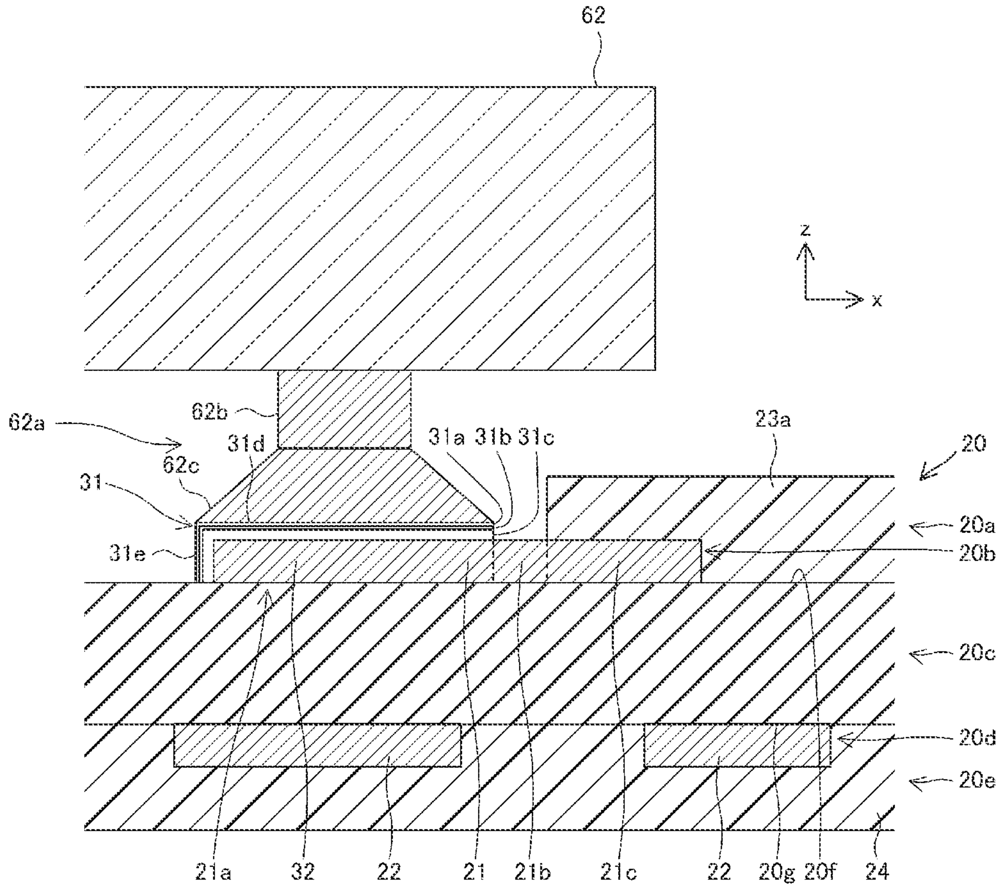
FIG. 8 is a schematic cross-sectional view of a semiconductor device of an embodiment after a reflow process.

As illustrated in FIG. 8, for the semiconductor device 10 according to an embodiment, the lead-out portion 21*b* is provided between the flip chip pad 21*a* and the wiring portion 21*c*.

In a reflow process, the solder bumps 62*c* on the chip-side flip-chip mounting terminals 62*a* are in a both-contacted state. Since the second wettability of the surface of the bare Cu wiring 33 in the lead-out portion 21*b* is less than the first wettability of the surface of the Au layer 31*a* in the flip chip pad 21*a*, the spread of the solder bump 62*c* is likely stop at the boundary between the flip chip pad 21*a* and the lead-out portion 21*b*.

Accordingly, the possibility of maintaining both-contacted state can be increased since a sufficient amount of solder can be provided between the copper pillar 62*b* and the electroless NiPdAu plating 31.

In addition, even when the logic/interface chip 62 is warped in the reflow process, the possibility of maintaining the both-contacted state can be increased since solder spread is limited. Therefore, the occurrence of an open state (non-connection) can be reduced.

In plan from the upper direction, the area of the flip chip pad 21*d* is larger than the area of the flip chip pad 21*a*. In the case of the pad having a large area such as the flip chip pad 21*d*, the position of the opening 51 of the solder resist 23*b* can be aligned with the position of the flip chip pad 21*d*.

On the other hand, when the formation accuracy of the openings in the solder resist is not sufficient for such alignment, the positions for the flip chip pads can not be formed with a high accuracy. In particular, when the area of the pad is small (like the flip chip pad 21*a*), the opening at the position of the pad is less likely to be formed accurately.

In the present disclosure, by setting the flip chip pad 21*a* (having a small area) as an NSMD type pad and preparing the lead-out portion 21*b* connected to the flip chip pad 21*a*, the outflow of solder can be reduced without using a solder resist. Therefore, even when the formation accuracy of the openings in the solder resist is not high, a configuration for reducing the outflow of solder from the flip chip pads can still be achieved.

MODIFIED EXAMPLE 1

Figure 9:
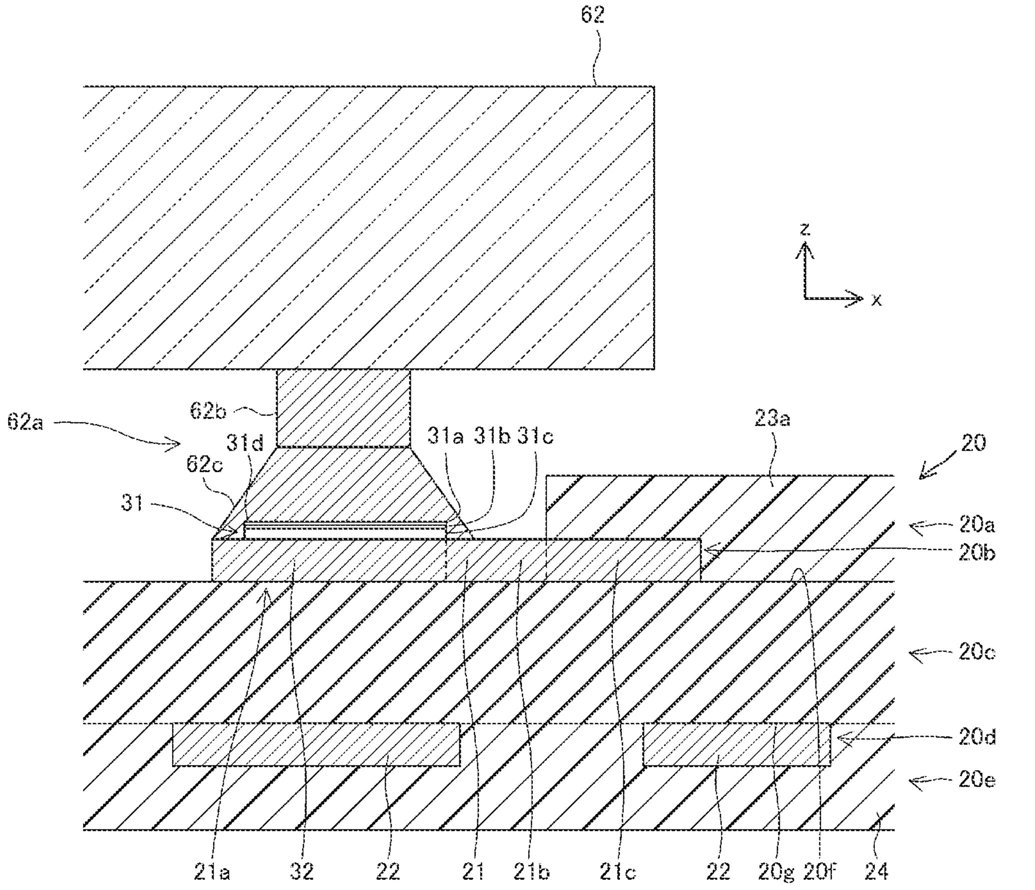
FIG. 9 is a schematic cross-sectional view of a semiconductor device of a modified example after a reflow process.

As illustrated in FIG. 9, a semiconductor device 10 according to a Modified Example 1 has a the flip chip pad 21*a* with the electroless NiPdAu plating 31 provided on the upper surface of the Cu wiring 32, but the electroless NiPdAu plating 31 is not provided on the side surface of the Cu wiring 32 (compare to FIG. 3 or FIG. 8).

In such a case, even when the amount of solder on the solder bumps 62*c* is large in the reflow process and the melted solder bumps 62*c* flow beyond the edge of the electroless NiPdAu plating 31, the spread of the solder can be reduced in the lead-out portions 21*b*. Accordingly, since a sufficient amount of solder can be secured between the copper pillar 62*b* and the electroless NiPdAu plating 31, the possibility of maintaining the both-contacted state can be increased. Therefore, the occurrence of the open state can be reduced.

Method for Manufacturing Semiconductor Device

Hereinafter, a method for manufacturing a semiconductor device 10 will be described below as an example of the method for manufacturing a semiconductor device according to the present disclosure.

Figure 10A:
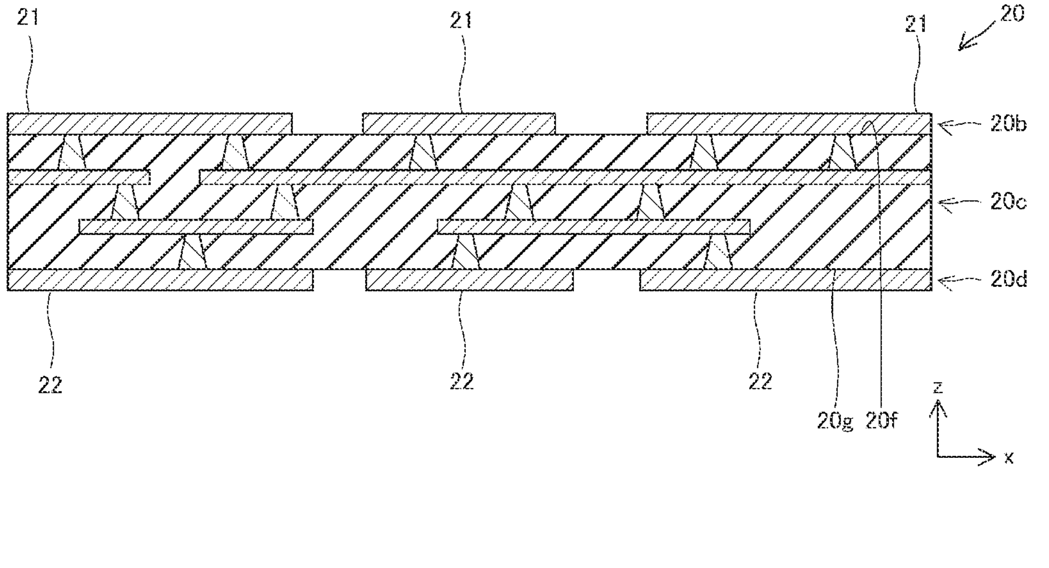
FIGS. 10A to 10G are schematic diagrams illustrating aspects of a process of manufacturing a semiconductor device of an embodiment.

First, as illustrated in FIG. 10A, the pattern 21 comprising the second metal (second material) having the second wettability to solder is formed on the main surface 20*f* of the insulating layer 20*c*. In addition, the pattern 22 comprising the second metal is formed on the main surface 20*g* of the insulating layer 20*c*.

Figure 10B:
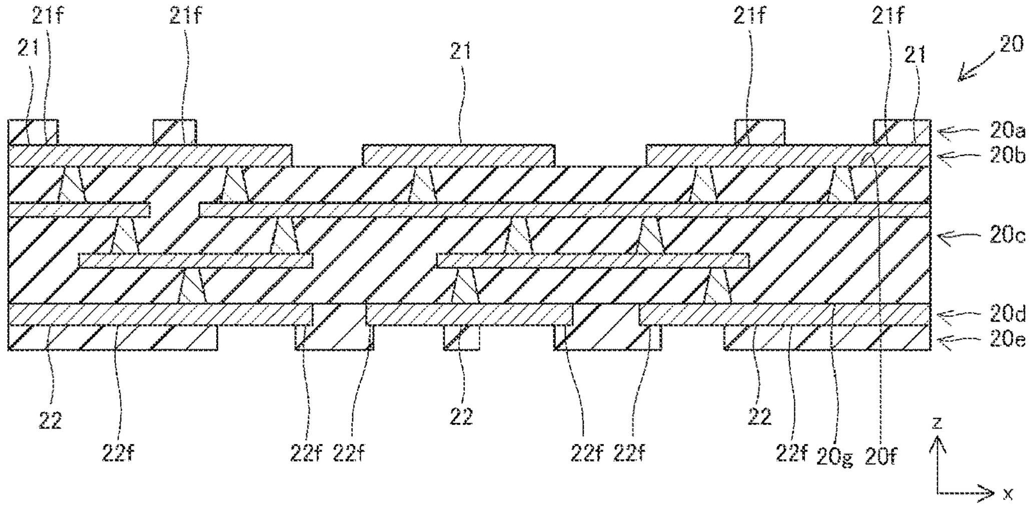

Next, as illustrated in FIG. 10B, the solder resist layer 20*a* is formed on the conductive layer 20*b*. Then, an exposure process and a developing process are performed on the solder resist layer 20*a*. By performing the etching process on the solder resist layer 20*a*, the solder resist layer 20*a* covering a portion of the pattern 21 (hereinafter, sometimes referred to as a non-exposed portion 21*f* (first conductive portion)) from the upper side is formed. Similarly, the solder resist layer 20*e* covers a portion of the pattern 22 (hereinafter, sometimes referred to as a non-exposed portion 22*f*) from the lower side.

Figure 10C:
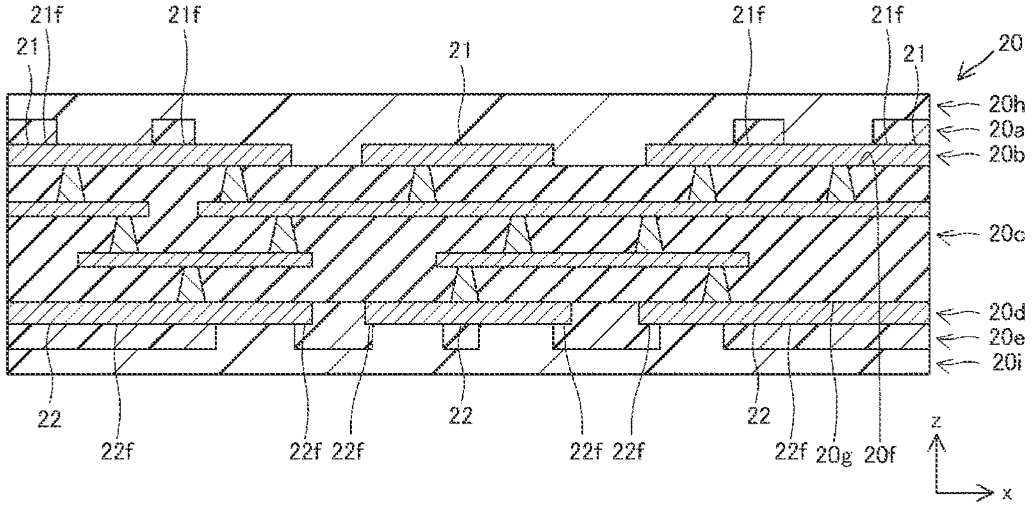

Next, as illustrated in FIG. 10C, a resist mask layer 20*h* (resist layer) is formed on the solder resist layer 20*a*. A resist mask layer 20*i* is formed on the solder resist layer 20*e*.

Figure 10D:
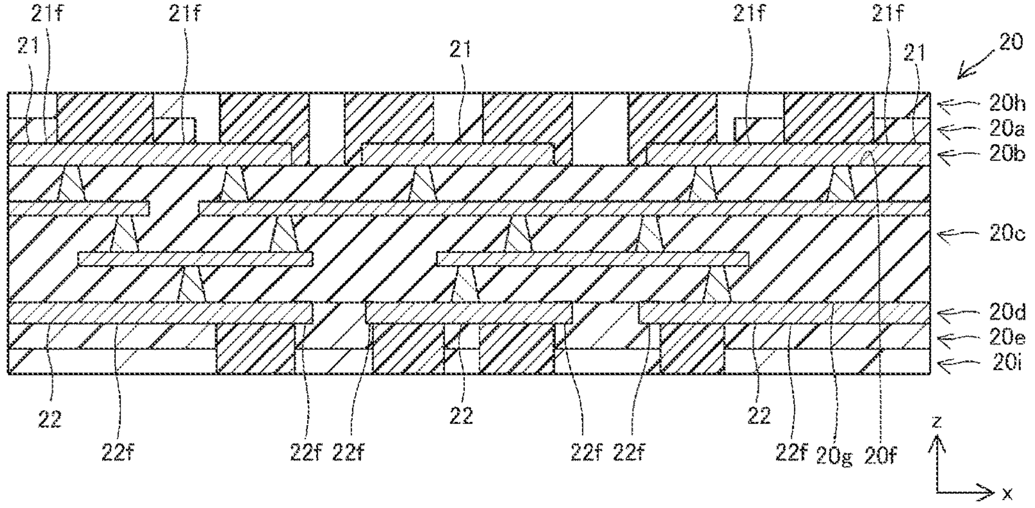

Next, as illustrated in FIG. 10D, an exposure process (photolithographic process) is performed on the resist mask layer 20*h* In addition, an exposure process (photolithographic process) is performed on the resist mask layer 20*i*.

Figure 10E:
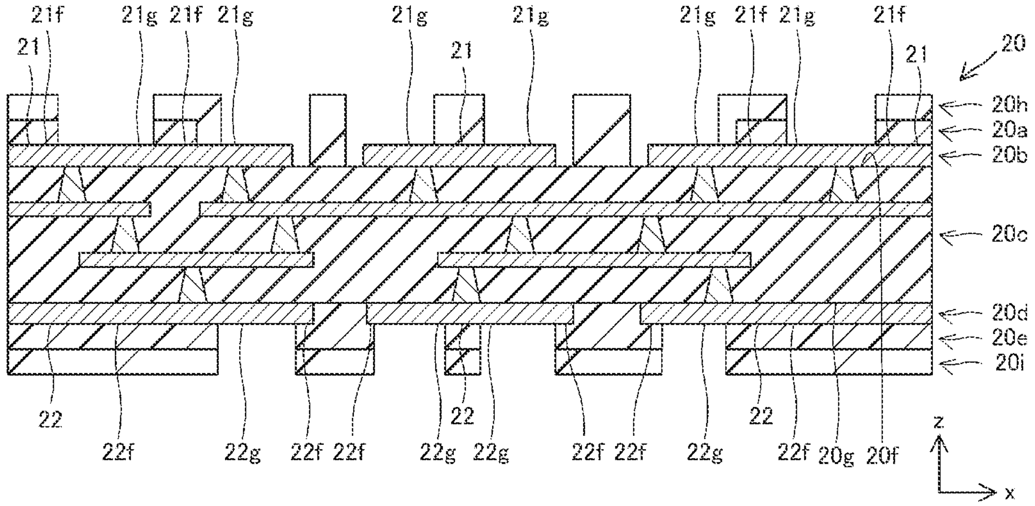

Next, as illustrated in FIG. 10E, by performing the developing process on the resist mask layer 20*h*, portions of the pattern 21 (hereinafter, referred to as a plating target portion 21*g* (third conductive portion)) are formed. The other portions of the conductive layer 20*b* exposed from the solder resist layer 20*a* but still covered with the resist mask layer 20*h* corresponds to the second conductive portion. Similarly, by performing the developing process on the resist mask layer 20*i* on the lower side, portions of the pattern 22 (hereinafter, sometimes referred to as a plating target portion 22*g*) are formed.

Figure 10F:
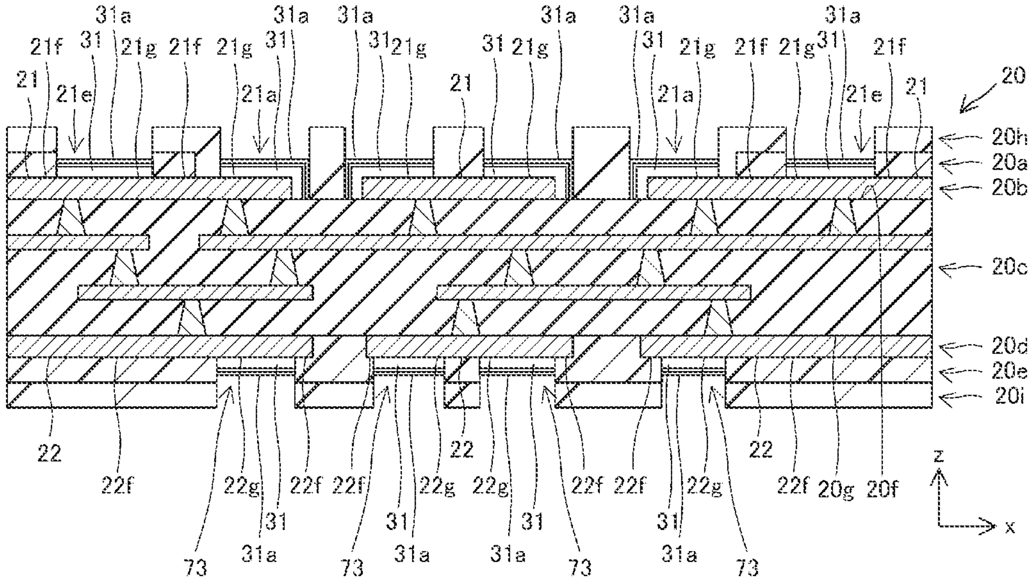

Next, as illustrated in FIG. 10F, the electroless NiPdAu plating 31 is formed on the plating target portion 21*g* by an electroless plating process. By forming the Au layer 31*a* (first material) having a first wettability larger than the second wettability towards solder, the flip chip pads 21*a* and 21*d* exposing the Au layer 31*a* and the wire bonding pad 21*e* are formed. In addition, the electroless NiPdAu plating 31 is formed on the plating target portion 22*g* by the electroless plating process.

Figure 10G:
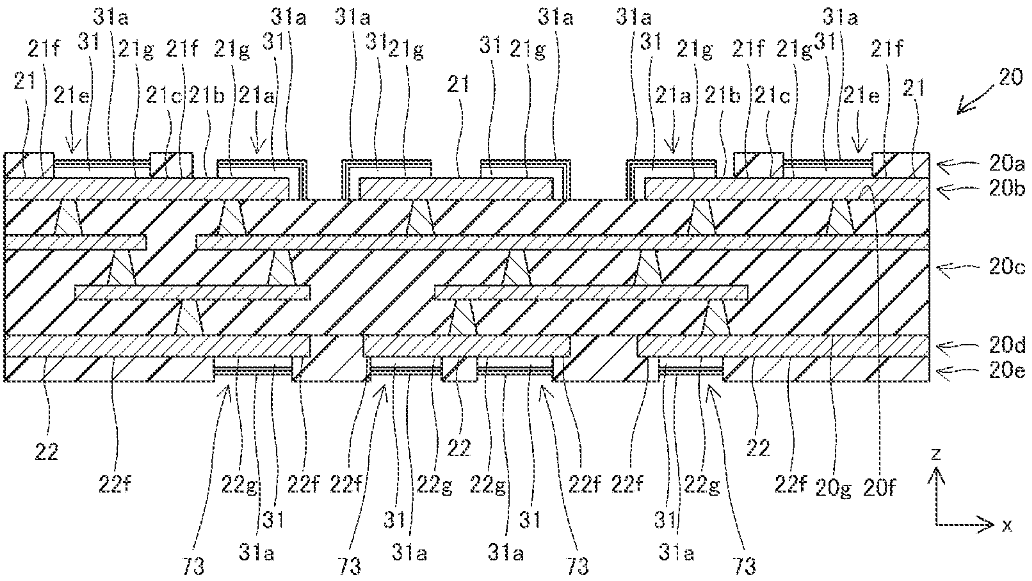

Next, as illustrated in FIG. 10G, by removing the resist mask layer 20*h*, the lead-out portion 21*b* connected to the flip chip pad 21*a* and exposing the second metal and the wiring portion 21*c* connected to the flip chip pad 21*a* through the lead-out portion 21*b* and covered with the solder resist layer 20*a* are formed. In addition, the resist mask layer 20*i* is removed.

Next, the logic/interface chip 62 is flip-chip connected to the wiring board 20 by connecting the chip-side flip-chip mounting terminals 62*a* and 62*d* of the logic/interface chip 62 to the flip chip pads 21*a* and 21*d*, respectively.

Method for Manufacturing Semiconductor Device According to Comparative Example A method for manufacturing a semiconductor device according to a comparative example ("Comparative Example") will be described below.

For the Comparative Example, the process of manufacturing the semiconductor device 10 illustrated in FIGS. to 10C is performed.

Figure 11A:
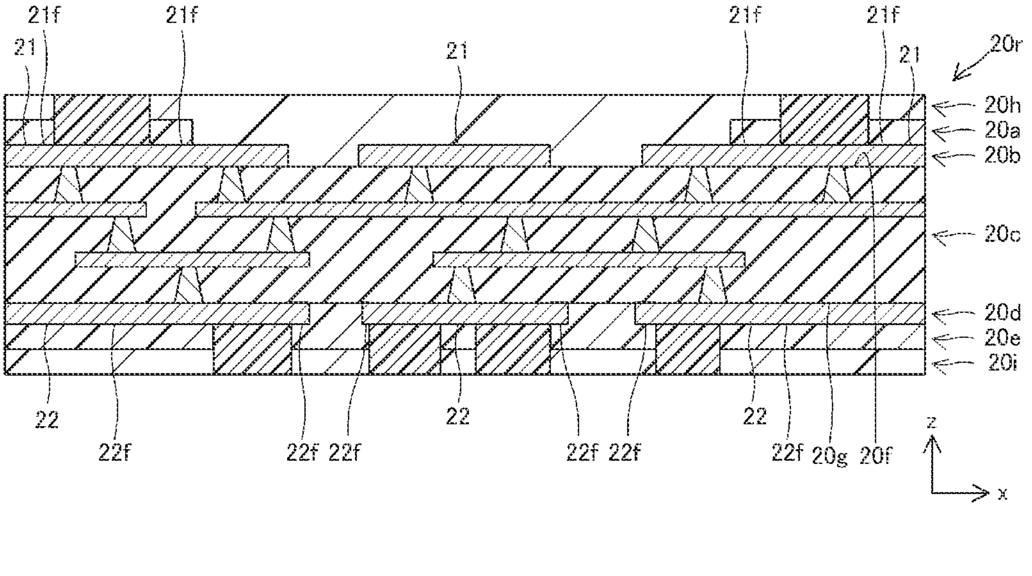
FIGS. 11A to 11E are schematic diagrams illustrating aspects of a process of manufacturing a semiconductor device according to a comparative example.

Next, as illustrated in FIG. 11A, an exposure process is performed on the resist mask layer 20*h* of a wiring board 20*r*. In addition, an exposure process is performed on the resist mask layer 20*i*. The regions to be exposed are different from that of the wiring board 20 illustrated in FIG. 10D.

Figure 11B:
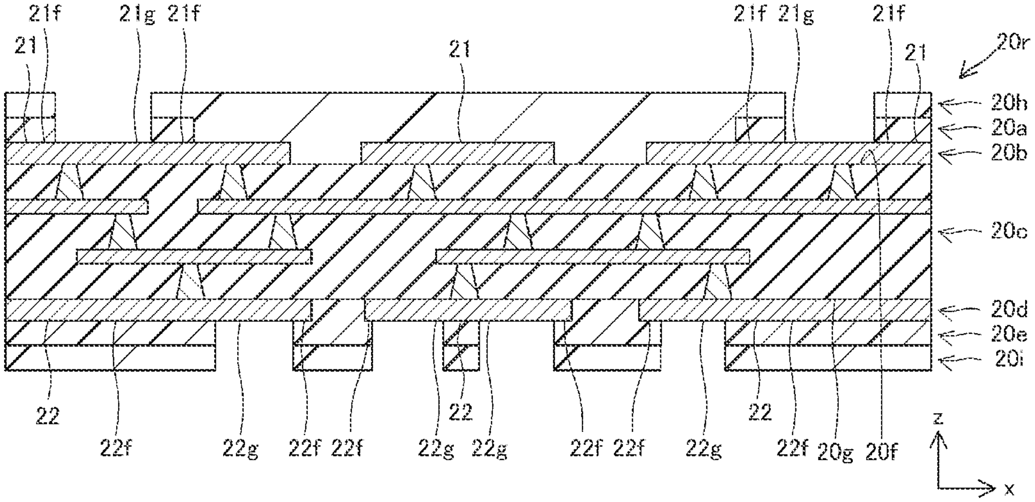

Next, as illustrated in FIG. 11B, when the developing process is performed on the resist mask layer 20*h*, the remaining portions of the resist mask layer 20*h* still cover the upper side of solder resist layer 20*a* but the plating target portion 21*g* is exposed by removal of portions of the resist mask layer 20*h*. In addition, a developing process is performed on the resist mask layer 20*i*, and the remaining portions of the resist mask layer 20*i* cover the solder resist layer 20*e* from the lower side but expose the plating target portion 22*g*.

Figure 11C:
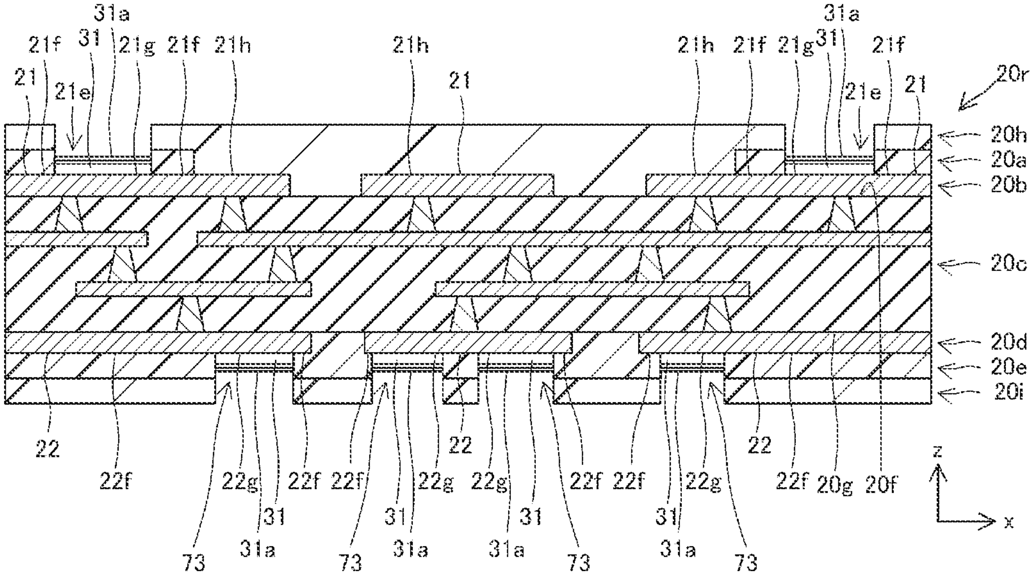

Next, as illustrated in FIG. 11C, the electroless NiPdAu plating 31 (plated film) is formed above the plating target portion 21*g* by the electroless plating process. By forming the Au layer 31*a*, a wire bonding pad 21*e* is formed in which the Au layer 31*a* is exposed (the Au layer 31*a* is the upper surface of the wire bonding pad 21*e*). In addition, the electroless NiPdAu plating 31 is formed on the plating target portion 22*g* by the electroless plating process.

Figure 11D:
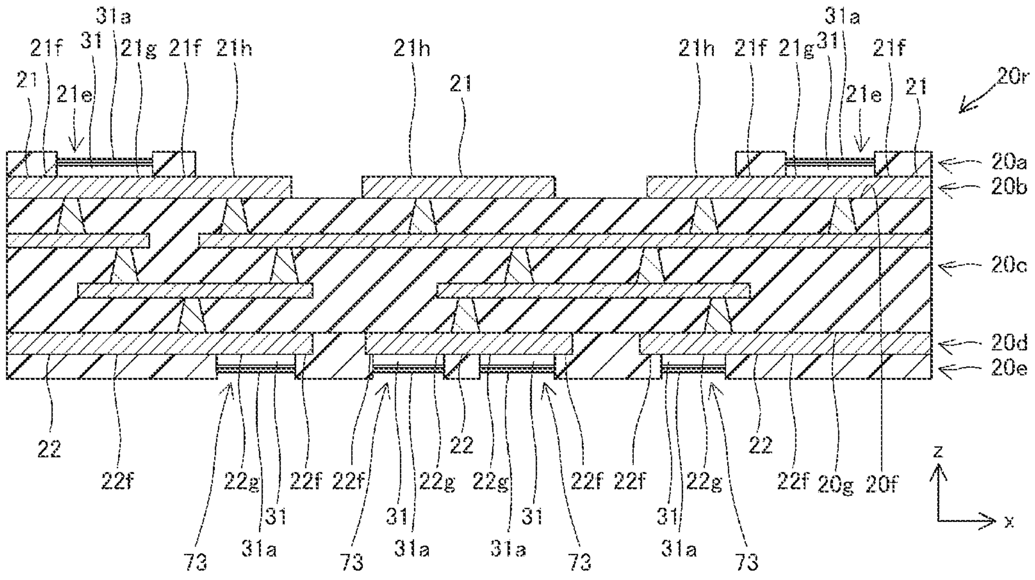

Next, as illustrated in FIG. 11D, by removing the still remaining portions of resist mask layer 20*h*, bare Cu wiring (sometimes referred to as an OSP target portion 21*h*) is exposed at the top surface of the wiring board 20*r*. In addition, the still remaining portions of the resist mask layer 20*i* are removed. At the bottom surface of the wiring board 20*r*, since the electroless NiPdAu plating 31 is applied to the pattern 22, bare Cu wiring is not exposed by removal of resist mask layer 20*i*.

Figure 11E:
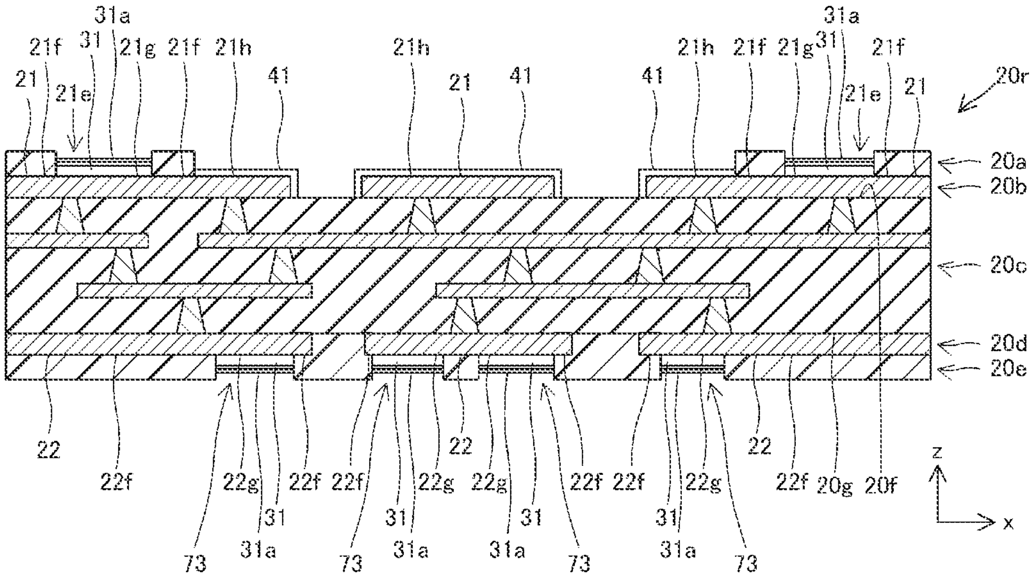

Next, as illustrated in FIG. 11E, on the wiring board 20*r*, an OSP film 41 (anti-tarnish film) is formed on the OSP target portions 21*h* (bare/exposed Cu wiring portions). It is noted that, as a pre-treatment before forming the OSP film 41, an acid etching treatment may be performed.

Subsequently, the OSP film 41 can be removed by flux or the like.

Next, the logic/interface chip 62 is flip-chip connected to the wiring board 20*r*.

When an OSP film 41 is not formed, an oxide film on the surface of the second metal forms containing copper as a main component on an unprotected OSP target portion 21*h* and the oxide film may become thick. As the oxide film becomes thicker, the adhesion to solder is deteriorated. When the time from the completion of the wiring board 20*r* to the time of the flip-chip connection of the logic/interface chip 62 becomes long, the solderability can be significantly deteriorated. Therefore, the process of forming the OSP film 41 on the OSP target portion 21*h* must generally be performed in order to limit the oxidation of the surface of the second metal.

In addition, for the OSP target portion 21*h* electrically connected to the wire bonding pad 21*e* through the pattern 21, in the acid etching treatment performed before the forming of the OSP film 41, a battery (electrochemical cell) is formed with gold of the Au layer 31*a*, copper in the OSP target portion 21*h*, and the like. In such a process, the copper in the flip chip pad may be becomes copper ions and dissolve into the acid etching solution, at least some portion of the OSP target portion 21*h* is consumed/lost.

For to the OSP target portion 21*h* not electrically connected to the wire bonding pad 21*e* through the pattern 21, since no battery (electrochemical cell) is formed, consumption of the OSP target portion 21*h* is reduced. That is, the thickness of the OSP target portion 21*h* may vary depending on the presence or absence of an electrical connection with the wire bonding pad 21*e* through the pattern 21. For this reason, the thickness of the flip chip pads varies, and thus, the possibility of the deterioration in the connectivity during the flip chip connection becomes high.

On the other hand, for the wiring board 20 illustrated in FIG. 10G, the electroless NiPdAu plating 31 is applied to all portions used for solder mounting of the flip chip pads 21*a* and 21*d*, the wire bonding pads 21*e*, the ball lands 73, and the like. It is noted that in some examples, the ball lands 73 may have a configuration in which an OSP film is formed instead the electroless NiPdAu plating 31 being used.

Since a natural oxide film is not formed on the Au layer 31*a* of the electroless NiPdAu plating 31, the deterioration in adhesion to the soldering can be reduced without requiring the forming of any OSP film. Therefore, the process of forming the OSP film and the process of removing such a film by flux are not required, and thus, the process of manufacturing the wiring board 20 can be simplified, and the manufacturing cost of the wiring board 20 can be reduced.

In addition, for the wiring board 20 illustrated in FIG. 10G, since no acid etching needs to be performed because the OSP film 41 is not going to be subsequently formed, any variations in the thickness of the flip chip pads 21*a* due to the formation of a battery effect or the like can be prevented.

In addition, even if the acid etching is performed for some purpose, since the electroless NiPdAu plating 31 is applied to all the flip chip pads 21*a* and the wire bonding pads 21*e*, no battery is formed between these pads. In other words, with respect to the wiring board 20 illustrated in FIG. 10G, even if an acid etching process is performed, the variations in the thickness of the flip chip pads 21*a* can be prevented.

(a) Although the configuration in which the electroless NiPdAu plating 31 is applied to the pattern 22 has been described as an embodiment, the present disclosure is not limited thereto. The pattern 22 may be applied with other types of plating such as electrolytic NiAu plating. When the wettability of the flip chip pad 21*a* (first wettability) is larger than the wettability of the lead-out portion 21*b* (second wettability), plating does not necessarily need to be applied to the flip chip pad 21*a*.

Although an example in which the first metal is a metal containing gold as a main component has been described, the present disclosure is not limited thereto. The first metal may contain a metal other than Au as a main component. In addition, while an example in which the second metal is a metal containing copper as a main component has been described, the present disclosure is not limited thereto. The second metal may contain a metal other than Cu as a main component.

(b) In an embodiment, a configuration in which the lead-out portion 21*b* is the bare Cu wiring 33 has been described, but the present disclosure is not limited thereto. If the second wettability of the lead-out portion 21*b* is less than the first wettability of the flip chip pad 21*a*, a configuration in which plating is applied to the lead-out portion 21*b* may be adopted.

Embodiments have been described above with reference to specific examples. However, the present disclosure is not limited to these specific examples. Modifications of these specific examples which would be obvious to those of ordinary skill in the art are also in the scope of the present disclosure. Example components described above may be modified in various aspects such as relative arrangements, processing conditions, shapes, and the like so long as the modifications still incorporate features of the present disclosure. The various components provided in the specific examples described above may be changed and/or combined as appropriate.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A wiring board, comprising:

a conductive layer on a first surface; and an insulating layer covering a portion of the conductive layer, wherein the conductive layer includes:

a first connection portion exposed from the insulating layer and having a first wettability to solder;

a lead-out portion connected to the first connection portion and exposed from the insulating layer and having a second wettability to solder, the second wettability being different from the first wettability; and a wiring portion connected to the first connection portion via the lead-out portion and covered with the insulating layer, and a tip end of the first connection portion has a side surface with the first wettability.

2. The wiring board according to claim 1, wherein an exposed surface of the first connection portion is coated with a gold layer.

3. The wiring board according to claim 2, wherein the lead-out portion is copper or a copper alloy.

4. The wiring board according to claim 1, wherein a surface of the first connection portion is coated with a nickel-palladium-gold plating.

5. The wiring board according to claim 4, wherein the nickel-palladium-gold plating does not extend onto the lead-out portion.

6. The wiring board according to claim 1, wherein an upper surface of first connection portion facing away from the first surface is a plated gold layer.

7. The wiring board according to claim 6, wherein the plated gold layer extends onto the side surface but not onto the lead-out portion.

8. The wiring board according to claim 1, further comprising:

a copper pillar extending in a direction away from the first surface, wherein the copper pillar is soldered to the first connection portion.

9. The wiring board according to claim 8, wherein the solder does not extend onto the lead-out portion.

10. The wiring board according to claim 8, wherein the copper pillar is connected to a semiconductor chip.

11. The wiring board according to claim 1, wherein a height of the lead-out portion from the first surface and a height of the wiring portion from the first surface are substantially the same.

12. The wiring board according to claim 1, wherein the second wettability is lower than the first wettability.

13. A semiconductor device, comprising:

a wiring board with a conductive layer on a first surface and an insulating layer covering a portion of the conductive layer, the conductive layer including:

a first connection portion exposed from the insulating layer and having a first wettability to solder;

a lead-out portion connected to the first connection portion and exposed from the insulating layer and having a second wettability to solder, the second wettability being different from the first wettability; and a wiring portion connected to the first connection portion via the lead-out portion and covered with the insulating layer; and a first semiconductor element with a first electrode soldered to the first connection portion, wherein a tip end of the first connection portion has a side surface with the first wettability.

14. The semiconductor device according to claim 13, wherein a second opening is in the insulating layer, and the conductive layer further includes:

a third connection portion in the second opening, the third connection portion having an upper surface facing away from the first surface that is coated with a gold layer.

15. The semiconductor device according to claim 14, further comprising:

a plurality of second semiconductor elements stacked on the first semiconductor element; and a wire connecting at least one of the second semiconductor elements and the third connection portion.

* * * * *